United States Patent [19]

Kumasaka et al.

[11] Patent Number: 4,701,628
[45] Date of Patent: Oct. 20, 1987

[54] CIRCUIT FOR SUPERVISING CONTACT FOR PASSENGER PROTECTIVE DEVICE

[75] Inventors: Toru Kumasaka, Osaka; Toshikazu Ohya; Koichi Kamiji, both of Saitama, all of Japan

[73] Assignees: NEC Home Electronics Ltd., Oska; Honda Giken Kogyo Kabushiki Kaisha, Saitama, both of Japan

[21] Appl. No.: 936,358

[22] Filed: Dec. 1, 1986

[30] Foreign Application Priority Data

Nov. 30, 1985 [JP] Japan .......................... 60-184763[U]

[51] Int. Cl.$^4$ ............................................ B60K 28/00
[52] U.S. Cl. ...................... 307/9; 307/10 R;
307/10 SB; 340/52 R; 340/52 H; 180/274; 280/735
[58] Field of Search ..................... 307/9, 10 R, 10 SB;
340/52 R, 52 E, 52 D, 52 F, 52 H, 53, 64, 77;
280/727, 728, 734, 735, 736, 737, 739, 748, 741,
742, 802; 180/268, 270, 283, 271, 272, 273, 274,
281, 282

[56] References Cited

U.S. PATENT DOCUMENTS

| | | | |
|---|---|---|---|
| 3,622,974 | 11/1971 | Best .................................. | 340/52 R |
| 3,629,816 | 12/1971 | Gillund .......................... | 280/735 X |
| 3,633,159 | 1/1972 | Dillman .......................... | 280/736 X |
| 3,668,627 | 6/1972 | Brainerd .......................... | 340/52 H |
| 3,949,357 | 4/1976 | Hosaka ........................... | 280/735 X |
| 4,087,782 | 5/1982 | Oishi et al. ...................... | 280/735 X |
| 4,220,871 | 9/1980 | Yasui et al. ........................ | 307/10 R |
| 4,222,030 | 9/1980 | Yasui et al. ........................ | 340/52 H |

Primary Examiner—William M. Shoop, Jr.
Assistant Examiner—Shik Leun Paul Ip
Attorney, Agent, or Firm—Staas & Halsey

[57] ABSTRACT

A contact supervising circuit for a rider protective device, in which an ignition switch, a collision sensor, and a detonator are connected in series to a DC power source, a monitoring resistor is connected in parallel to the collision sensor, and a monitoring switch is connected in series to the monitoring resistor. The device comprises delay means for closing a contact of the monitoring switch with a period of delay to interrupt a monitoring current flowing from the DC power source through the monitoring resistor for a predetermined period of time after turning-on of the ignition switch. The device further comprises assertion means for supervising the monitoring current and for asserting the fact that the monitoring current does not flow during the period of delay in which the closing the contact of the monitoring switch is delayed by the delay means.

6 Claims, 5 Drawing Figures

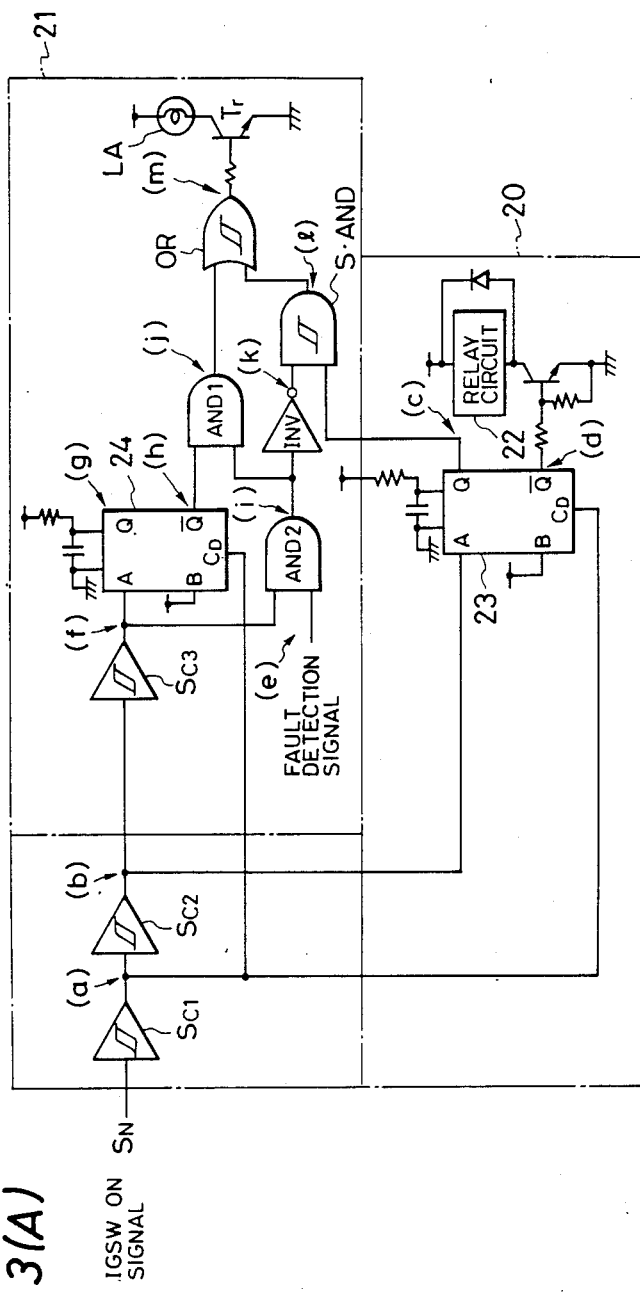
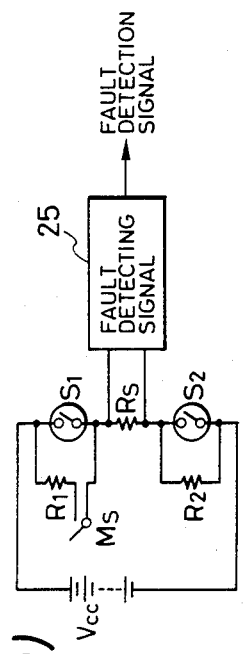
FIG. 3(A)
FIG. 3(B)

CIRCUIT FOR SUPERVISING CONTACT FOR PASSENGER PROTECTIVE DEVICE

BACKGROUND OF THE INVENTION

The present invention relates to a contact supervising circuit for a passenger protective device, for example, an air bag device for a vehicle, for securing the normal operation of the passenger protective device, more particularly to a contact supervising circuit for a passenger protective device in which a contact of a monitoring switch for controlling a flow of a monitoring current is supervised.

Known is a passenger protective device for safely protecting passengers by operating an air bag device upon collision of a vehicle. Such a passenger protective device of the kind as described above is so arranged that when a vehicle collides, a collision sensor detects the collision and a detonator is ignited to thereby bulk an air bag device.

It is impossible to secure safety of passengers when a fault is generated in the passenger protective device, and therefore supervision is always made as to whether the passenger protective device can normally operate or not.

As shown in FIG. 1, the conventional passenger protective device is provided with an ignition switch IGSW, two collision sensors S1 and S2, and a detnator Rs disposed between the two collision sensors S1 and S2 connected in series to a DC power suource. The device further comprises monitoring resistors R1 and R2 connected in parallel to the two collision sensors S1 and S2, respectively.

Then, supervision is made as to whether a monitoring current flows or not through the monitoring resistors R1 and R2 when the ignition switch IGSW of the passenger protecrive device is turned on, so that the possibility of the normal operation of the passenger protective device is asserted when the monitoring current flows.

In the conventional passenger protective device, assertion of the normal operation thereof has been effected as described above. Such a device is disadvantageous in that there is a possibility that the monitoring current does not flow in case that chattering of the ignition switch IGSW occurs as if when vehicle collision actually occurs even if the monitoring current is supervised, further, it becomes impossible to supervise the monitoring current when the ignition switch IGSW is turned off when the vehicle is parked, for example.

Then, in order to eliminate the foregoing problems, the passenger protective device is directly connected to the DC power source Vcc instead of being connected through the ignition switch IGSW, as shown by a dotted line in FIG. 1.

In the case where the passenger protective device is directly connected to the DC power source Vcc, however, another problem has arisen as to cause a risk of overdischarge of the DC power source Vcc (that is, the battery) or deterioration of the detonator Rs because a little monitoring current is allowed to flow always through the monitoring resistors R1 and R2.

In order to solve the latter problem, there has been proposed an arrangement shown in FIG. 2, for example. In the device shown in FIG. 2, a monitoring switch Ms operated in association with the ignition switch IGSW is connected in series to at least one of the two monitoring resistors R1 and R2 so that the monitoring switch Ms is closed simultaneously when the ignition switch IGSW is closed.

In this arrangement, however, there is a further problem that the contact of the monitoring switch Ms must be kept being supervised because there is a risk of overdischarge of the battery or deterioration of the detonator when the monitoring switch Ms is kept closed due to a fault thereof or the like, similarly to the case where passenger protective device is directly connected to the DC power source Vcc, as described above.

SUMMARY OF THE INVENTION

An object of the present invention is to provide a contact supervising circuit for a passenger protective device, in which supervision can be made as to whether the contact of the monitoring switch Ms can normally operate or not to prevent overdischarge of a battery and deterioration of a detonator due to such a condition that the contact of the monitor switch Ms is kept closed.

According to the present invention, the contact supervising circuit for a passenger protective device is provided with an ignition switch, a collision sensor and a detonator connected in series to a DC power source, a monitoring resistor connected in parallel to the collision sensor, and a monitoring switch connected in series to the monitoring resistor. The device of the invention is characterized by delay means for closing a contact of the monitoring switch with a period of delay to interrupt a monitoring current flowing from the DC power source through the monitoring resistor for a predetermined period of time after turning-on of the ignition switch, and by assertion means for supervising the monitoring current and for asserting the fact that the monitoring current does not flow during the period of delay in which the closing of the contact of the monitoring switch is delayed by the delay means.

In the contact supervising circuit for a passenger protective device, according to the present invention, closure of the contact of the monitoring switch is delayed by a predetermined period by the delay means so that the assertion means asserts that the monitoring current does not flow in the predetermined period of delay.

BRIEF DESCRIPTION OF THE DRAWINGS

FIG. 3 (A) and (B) are circuit diagrams showing an embodiment of the contact supervising circuit for a passenger protective device according to the present invention

DETAILED DESCRIPTION OF THE INVENTION

Figure 1:
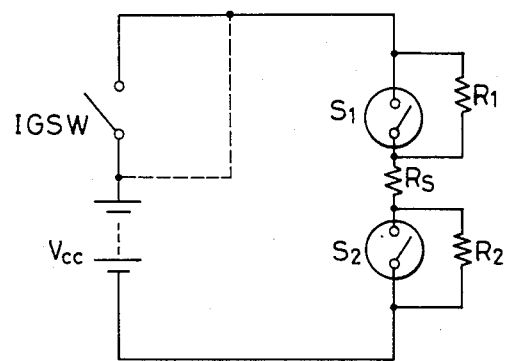
FIGS. 1 and 2 are circuit diagrams of the conventional contact supervising circuit for a passenger protective device.
Figure 2:
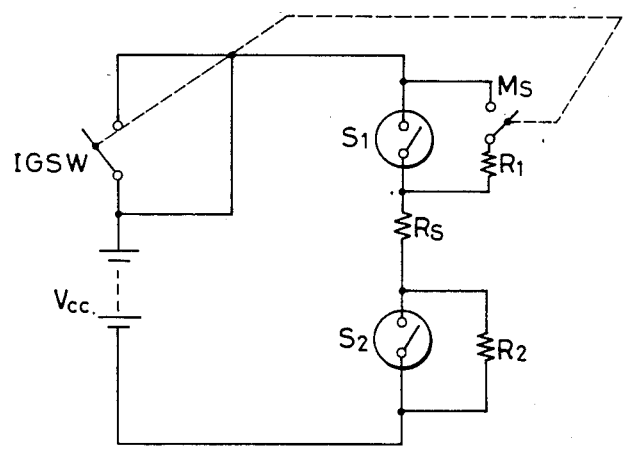

A preferred embodiment of the present invention will be described in detail with reference to FIGS. 3 and 4.

In FIG. 3, the drawing (A) is a block diagram showing an embodiment of the contact supervising circuit for a passenger protective device according to the present invention.

In the drawing, a block 20 shown by a dashed line is delay means which is a constituent element of the contact supervising circuit for a passenger protective device according to the present invention. The delay means 20 is provided with a relay circuit 22. The relay circuit 22 is operated in response to an inverted output of a binary digital element 23 to open/close a contact of a monitoring switch Ms shown in the drawing (B) of FIG. 3. The binary digital element 23 receives an "ON" signal of an ignition switch IGSW delayed through Schmitt trigger circuits Sc1 and Sc2.

Another block 21 shown by a dashed line is assertion means which is another constituent element of the contact supervising circuit for a passenger protective device according to the present invention similarly to the block 20. The assertion means is provided with a Schmitt trigger circuit Sc3 in addition to the Schmitt trigger circuits Sc1 and Sc2 which are common with the delay means 20.

The reference symbol LA designates an assertion lamp connected to the collector of a transistor Tr with its base connected to the output of an OR circuit OR.

The inputs of the OR circuit OR are respectively connected to an AND circuit AND1 and an AND circuit S.AND incorporating therein a Schmitt trigger circuit. One input of the AND circuit AND1 is connected to the inverted output $\bar{Q}$ of a binary digital element 24. One input of the AND circuit S.AND is connected to the output of an invertor INV the input of which is in turn connected to the output of an AND circuit AND2.

The output of the AND circuit AND2 is connected to the other input of the AND circuit AND1. One input of the AND circuit AND2 is connected to the output of the Schmitt trigger circuit Sc3. The other input of the AND circuit AND2 is connected to the output of a fault detecting circuit 25 shown in the drawing (B) of FIG. 3. The other input of the AND circuit S.AND is connected to the output terminal Q of the binary digital element 23.

Next, description will be made as to the operation of the thus arranged contact supervising circuit for a passenger protective device according to the present invention with reference to an operational waveform diagram of FIG. 4.

Figure 4:
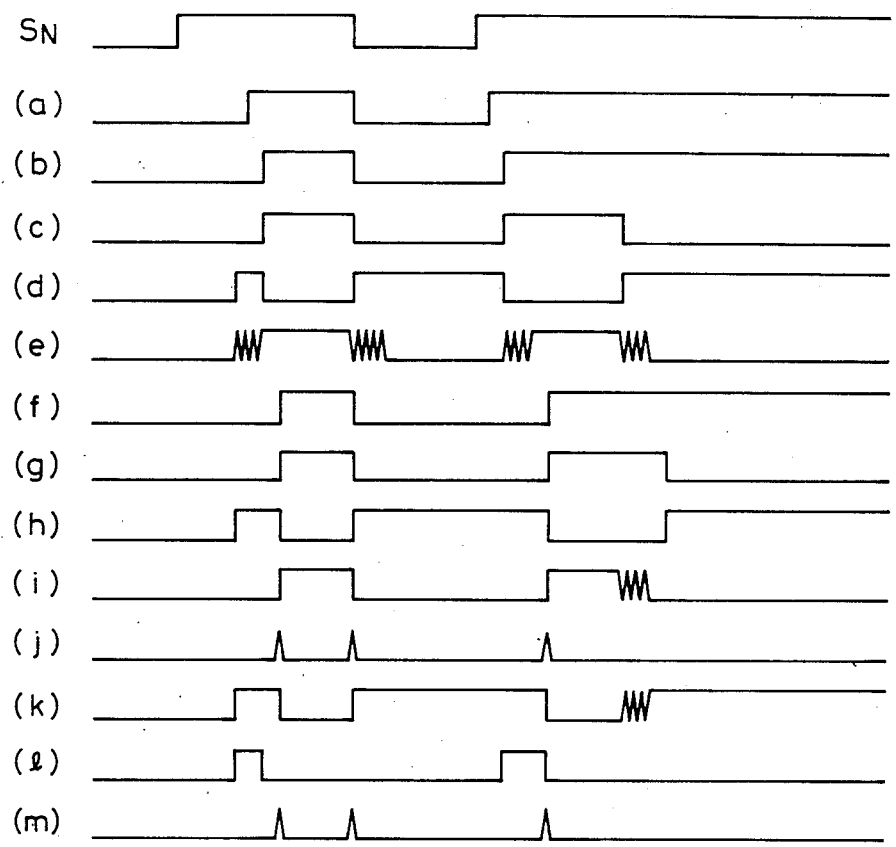
FIG. 4 is a diagram showing operational waveform of the respective portions of the same contact supervising circuit for a passenger protective device.

Respective waveforms shown by symbols in FIG. 4 correspond to those shown by the same symbols in the drawing (A) of FIG. 3, that is, FIG. 4 shows respective voltage waveforms at positions correspondingly shown by the symbols.

First, upon application of an "ON" signal SN to the Schmitt trigger circuit Sc1 from the ignition switch IGSW, the Schmitt trigger circuit Sc1 produces a delayed output as shown in (a) of FIG. 4. Similarly to this, signal delay processing is successively performed through the Schmitt trigger circuits Sc2 and Sc3 as shown in (b) and (f) of FIG. 4.

When a power source has been established after application of the "ON" signal SN, that is, after a predetermined time has elapsed, the output of the Schmitt trigger circuit Sc2 is applied to the binary digital element 23 and then the relay circuit 22 is driven by the inverted output of the binary digital element 23 to close the contact of the monitoring switch Ms in the drawing (B) of FIG. 3. The contact is supervised by the assertion means during the interval of delay until the contact of the monitoring switch Ms is closed.

That is, if the monitoring switch Ms operates normally without closing the contact thereof when the ignition switch IGSW is turned on, the output of the OR circuit OR outputs a thin pulse waveform as shown in (m) of FIG. 4 owing to the signal processing through the AND circuits AND1 and AND2, the inverter INV, the AND circuit S.AND. Therefore, the transistor Tr is not driven to turn the assertion lamp LA on even if a fault detection signal as shown in (e) of FIG. 4 due to chattering of the ignition switch IGSW or the like is supplied from the fault detecting circuit 25.

On the contrary, if the contact of the monitoring switch Ms is kept closed due to welding or the like when the ignition switch IGSW is turned on, a monitoring current is allowed to flow from the DC power source Vcc through the monitoring resistor R1 and the monitoring switch Ms and detected by the fault detecting circuit 25. Thus, the fault detecting circuit 25 supplies the AND circuit AND2 with a fault detection signal having a voltage waveform different from that shown in (e) of FIG. 4.

Thereafter, the signal is subjected to a predetermined signal processing through the AND circuits AND1 and AND2, the invertor INV, and the AND circuit S.AND in the same manner as in the foregoing case and applied to the OR circuit OR.

In the above case, the output of the OR circuit OR takes a form of a periodic rectangular pulse to drive the transistor Tr to turn the assertion lamp LA on.

By asserting this state of the assertion lamp LA by eyes, it can be noted that the contact of the monitoring switch Ms is kept closed, thereby enabling repairs to be done at an early stage in order to prevent overdischarge of the battery or deterioration of the detonator.

The circuit components constituting the delay means 20 and the assertion means 21 are not limited to those described above but can be substituted by any other circuit components having equivalent functions.

As described above, the contact supervising circuit for a passenger protective device according to the present invention is arranged such that the contact of the monitoring switch is closed with a predetermined period of delay after turning-on of the ignition switch by using the delay means to enable the assertion means to assert the fact that no monitoring current flows in the predetermined period of delay in the predetermined delayed time. Accordingly, flowing of a monitoring current indicates the closure of the contact of the monitoring switch for a certain reason, thereby providing such an excellent effect that it is possible to prevent overdischarge of the battery or deterioration of the detonator.

What is claimed is:

1. A circuit for supervising contact for passenger protective device in which an ignition switch, at least one collision sensor, and a detonator are connected in series to a DC power source, comprising:
   at least one monitoring resistor connected in parallel to said collision sensor;
   at least one monitoring switch connected in series to said monitoring resistor;
   means for closing a contact of said monitoring switch with a predetermined period of delay after turning-on of said ignition switch; and
   means for asserting the fact that a monitoring current flowing from the DC power source through said monitoring resistor does not flow during said predetermined period of delay.

2. A circuit of claim 1, further comprising a fault detecting circuit connected in parallel to said detonator, the output of said fault detecting circuit being connected to said asserting means.

3. A circuit of claim 1, wherein said asserting means comprises an assertion lamp.

4. A circuit of claim 1, wherein said asserting means comprises at least one Schmitt trigger circuit connected to said ignition switch.

5. A circuit of claim 4, wherein said asserting means comprises a binary digital element connected to the output of said Schmitt trigger circuit.

6. A circuit of claim 5, wherein said delay means comprises a binary digital element connected to the output of said Schmitt trigger circuit.

* * * * *

UNITED STATES PATENT AND TRADEMARK OFFICE
CERTIFICATE OF CORRECTION

PATENT NO. : 4,701,628
DATED : Oct. 20, 1987
INVENTOR(S) : Kumasaka et al.

It is certified that error appears in the above-identified patent and that said Letters Patent is hereby corrected as shown below:

Col 1, line 28, "detnator" s/b --detonator--;
Col 1, line 30, "suource" s/b --source--;
Col 1, line 37, "protecrive" s/b --protective--.
Col 4, line 1, "(m)" s/b --(e)--;
Col 4, line 5, "(e)" s/b --(m)--.

Signed and Sealed this

Nineteenth Day of April, 1988

Attest:

DONALD J. QUIGG

*Attesting Officer*        *Commissioner of Patents and Trademarks*